United States Patent [19]
Beale

[11] 3,821,774
[45] June 28, 1974

[54] ELECTROLUMINESCENT SEMICONDUCTOR DEVICES

[75] Inventor: Julian Robert Anthony Beale, Salfords, England

[73] Assignee: U.S. Philips Corporation, New York, N.Y.

[22] Filed: July 17, 1972

[21] Appl. No.: 272,682

[30] Foreign Application Priority Data

July 28, 1971 Great Britain .................... 35401/71

[52] U.S. Cl. ...........357/17, 357/16, 357/40, 357/61
[51] Int. Cl. ............................................ H01l 15/02
[58] Field of Search..........317/235, 317/27, 317/42, 317/22

[56] References Cited

UNITED STATES PATENTS

| | | | |
|---|---|---|---|
| 3,398,311 | 8/1968 | Page | 313/108 |
| 3,416,047 | 12/1968 | Beale et al. | 317/234 |
| 3,466,512 | 9/1969 | Seidel | 317/235 |

*Primary Examiner*—Rudolph V. Rolinec
*Assistant Examiner*—E. Wojciechowicz
*Attorney, Agent, or Firm*—Frank R. Trifari

[57] ABSTRACT

An electroluminescent semiconductor device comprising, a first semiconductor body portion of a first conductivity type comprising wide energy band gap, luminescent material, a second semicondcutor body portion comprising narrow energy band gap material adjacent the first portion and forming with said first portion an abrupt heterojunction, and transistor means located in the second portion for producing and heating charge carriers of an opposite second conductivity type in the second portion, so that hot said charge carriers are injected from the second portion into the first portion to produce luminescence therein and further such transistor means for extracting from said first portion those of the heated said charge carriers of said second conductivity type not permanently injected into said first portion.

17 Claims, 5 Drawing Figures

ELECTROLUMINESCENT SEMICONDUCTOR DEVICES

This invention relates to electroluminescent semiconductor devices comprising a wide energy band gap, luminescent semiconductor body portion of one conductivity type, and a narrow energy band gap semiconductor body portion adjacent the wide band gap portion and forming therewith an abrupt heterojunction at which the semiconductor energy band structure is discontinuous, luminescence being produced in the wide energy band gap portion by injection therein of charge carriers of the opposite conductivity type from the narrow band gap portion.

Electroluminescent diodes are known, comprising a single crystal body of semiconductor material, for example gallium phosphide, in which one body portion of one conductivity type forms *p-n* junction with another body portion of the opposite conductivity type. When the *p-n* junction is suitably biased in the forward direction, charge carriers of the opposite conductivity type are injected across the junction into the one portion of the one conductivity type and produce luminescence in the one portion by the recombination with majority charge carriers of that one portion. The characteristics of the luminescence produced are determined by the width of the energy band gap of the semiconductor material, and the impurity and excitation levels therein. In particular, the band gap of the semiconductor material sets an approximate upper limit to the energy of the recombination luminescence from a given semiconductor material. An efficient electroluminescent diode emitting red light has been formed in this manner from monocrystalline gallium phosphide having zinc and oxygen recombination centres at deep levels in the energy band gap.

Considerable difficulty has been experienced in producing electroluminescent devices emitting shorter wavelength light, namely green and blue. The band gap of gallium phosphide is approximately 2.26 eV at 300°K so that blue light cannot be obtained from this material by injection electroluminescence. Although green luminesce is obtainable from gallium phosphide diodes with shallow nitrogen recombination centres, the external quantum efficiency is low as a result of thermal quenching by other, unwanted impurity centres in the material.

To provide electroluminescent devices emitting such shorter wavelengths, attention has been given to semiconductor materials having wider energy band gaps, for example at least 2.5 eV In $A_{II}$-$B_{VI}$ compounds such as zinc sulphide, cadmium sulphide, and zinc selenide, the band gap is wide enough to provide efficient shorter wavelength luminescence. The luminescent centres can be deep enough in the energy band gap to avoid significant thermal quenching; thus, the effect of unwanted impurities in the semiconductor material can be minimised. However, it is known to be exceptionally difficult, even impossible in some circumstances, to provide a *p-n* junction in such semiconductor materials; this appears to be due to compensation of the introduced donor or acceptor impurity by the automatic production of lattice defects.

Since *p-n* junctions often cannot be prepared in semiconductor materials having desirably wide band gaps, there is considerable interest in the electrical and electro-optical properties of heterojunctions involving these materials. In such heterojunction devices, minority charge carriers are injected from one material into the wide band gap luminescent semiconductor material to produce luminescence therein.

In one comparatively successful form of heterojunction device, the minority charge carriers are injected from a semi-transparent metal electrode, for example of gold, through a thin insulating layer into the wide band gap semi-conductor material, for example of cadmium sulphide. Such a device requires the provision of a very thin insulating layer, for example approximately 100 A° of silica or calcium fluoride, to permit tunnelling of the charge carriers from the metal to the semiconductor. In general, the injection is low because of pin-holes in the insulating layer and the presence of fast radiationless recombination centres at the interfaces between the different materials. Instead of conventional forward biasing, it has been proposed to apply a large a.c. field across the device. The field is such as to cause during half cycle enough energy band bending to produce a charge inversion layer at the surface of the semiconductor material by tunnelling or/and avalance multiplication. During the opposite half cycle, minority charge carriers so accumulated in the inversion layer drift into the semiconductor interior and recombine to produce luminescence. However, the external quantum efficiency remains low.

Heterojunction electroluminescent devices in which the minority charge carriers are injected from a narrow band gap semiconductor material such as silicon are desirable. Thus, for example, various logic memory functions could be combined with such heterojunction light sources by providing both these functions and the silicon body portion of the light sources as parts of the same silicon substrate of an integrated circuit. Many types of semiconductor-semiconductor abrupt heterojunction diodes have been proposed and tried. The semiconductor band structure is discontinuous at the heterojunction. Carrier injection from the narrow to the wide band gap body portion is in opposition to the normal tendency of such a junction. Thus, for example, hole injection efficiency from *p*-type silicon into an *n*-type II-VI semiconductor is low because of the large step between the valence bands of the low resistivity silicon and the *n*-type wide band gap material. The efficiency can be increased by making the surface of the wide band gap material highly resistive or insulating, the hole injection being effected by both thermal emission and tunnelling. However, these structures also suffer from the disadvantages of low injection ratio and high radiationless recombination rates at surface states. Even if operated under reverse bias avalanche conditions, the power conversion efficiency remains low; furthermore, the high avalanche voltage required for such an electroluminescent device may be higher than voltages used in associated circuitry.

According to the present invention, an electroluminescent semiconductor device comprises a wide energy band gap, luminescent, semiconductor body portion of one conductivity type, a narrow energy band gap semiconductor body portion adjacent the wide band gap portion and forming therewith an abrupt heterojunction at which the semiconductor energy band structure is discontinuous, and a transistor structure adjacent the wide band gap portion and comprising the narrow band gap portion and electrode connections thereto, which transistor structure provides one arrangement for producing a current of charge carriers of the opposite conductivity type in the narrow band gap portion, another arrangement for providing in the narrow band gap portion adjacent the wide band gap portion such a high electric field for increasing the energy of charge carriers produced by the one arrangement that hot charge carriers of the said opposite conductivity type are injected from the narrow band gap portion into the wide band gap portion of the one conductivity type to produce luminescence therein, and means adjacent the wide band gap portion for extracting heated charge carriers of the said opposite conductivity type not permanently injected in the wide band gap portion.

The phrase "forming therewith an abrupt heterojunction at which the semiconductor energy band structure is discontinuous" is to be understood herein as including those structures in which a thin layer is present between, and prevents any physical contact between, the narrow and wide band gap portions; such a thin layer may be a thin metal electrode which, as described hereinafter, may form a rectifying junction with the narrow band gap portion and serve as the collector of the said transistor structure.

The term "hot" charge carriers is well known in the semiconductor art as a designation of charge carriers which have an average energy considerably in excess of the semiconductor lattice temperature, for example a carrier temperature several times the lattice temperature. It should be noted that in certain prior art heterojunction electroluminescent diodes described hereinbefore where avalanche operation is proposed, that hot charge carriers are injected into wide band gap semiconductor material from narrow band gap semiconductor material. However, in that case, the charge carriers are both produced and heated in the avalanche breakdown of a reverse-biased junction so that the magnitude of the carrier current cannot be determined independently of the degree of heating of the carriers; the avalanche breakdown produces electron-hole pairs so that both minority and majority charge carriers are heated; the abrupt heterojunction between the wide and narrow band gap semiconductor materials is reverse-biased into breakdown; and there is no means for extracting heated minority charge carriers not permenantly injected in the wide band gap portion.

In the electroluminescent semiconductor device according to the present invention, the transistor structure provides one arrangement for producing, and another arrangement for heating, the injected minority charge carriers. Thus, the magnitude of the minority charge carrier current produced by the one arrangement can be determined more independently of the degree of heating of these charge carriers by the other arrangement. Thus, the magnitude of the injected minority charge carrier current can be controlled to produce a satisfactory luminous output at an acceptable power conversion efficiency. The heterojunction between the wide and narrow band gap portions can be forward biased to assist injection into the wide band gap portion. Means are provided for extracting heated minority charge carriers not permanently injected in the wide band gap portion so that such carriers do not form a space charge neutralising the high electric field which heats the charge carriers. Furthermore, the charge carriers of the said opposite conductivity type are produced and heated by this device structure without the same structure similarly producing and heating charge carriers of the one conductivity type such as occurs with pair production in avalanche breakdown.

In one preferred form, the narrow band gap portion is of silicon, since both silicon material technology and semiconductor device technology in silicon are well advanced and comparatively cheap.

The high electric field which provides heating of the charge carriers may be produced substantially normal or, in certain cases, even substantially parallel to the surface.

In certain cases, the transistor structure may comprise at the surface of the narrow band gap portion adjacent the wide band gap portion, source, drain and channel of a field effect transistor, which channel is a shallow surface layer of the opposite conductivity type in a part of the narrow band gap portion of the one conductivity type. In one form, the source and drain are metal electrodes which form rectifying Schottky junctions with the part of the narrow band gap portion of the one conductivity type. In another form, the source and drain comprise source and drain electrodes contacting source and drain regions of the said opposite conductivity type present in the part of the narrow band gap portion of the one conductivty type. The shallow surface layer forming the channel may in certain cases be an inversion layer induced at the surface of the narrow band gap portion by charges at or near this surface. However, the said shallow surface layer may be an impurity-doped semiconductor region, preferably, for example, formed by implanted impurity of the said opposite conductivity type. The implantation may be effected by conventional implantation of impurity ions of the said opposite conductivity type at the surface of the narrow band gap portion where the wide band gap portion is to be provided. In another form, the implantation is effected by ion bombardment of a layer of impurity of the said opposite conductivity type at the said surface, which bombardment is such as to knock, by energy transfer, impurity atoms from the layer into the surface of the narrow band gap portion to form the shallow surface layer.

Such a field effect transistor provides means for injecting hot carriers of the said opposite conductivity type using the high electric field produced in operation between the source and drain. This field is substantially parallel to the surface, as is the carrier drift in this device. The temperature of the charge carriers of the one conductivity type flowing in the direction of the high electric field can be raised to several times the lattice temperature. The high electric field may be of the order of $10^4$ or $10^5$ volts/cm. The source provides the one arrangement for producing the carrier current and the drain provides the means for extracting those heated charge carriers of the opposite conductivity type not permanently injected.

In a preferred form, the transistor structure is an inverted bipolar transistor having collector, base and emitter electrode connections, which transistor comprises a collector situated at the surface of the narrow band gap portion adjacent the wide band gap portion and separated by a base region of the one conductivity type from a surface-remote emitter region of the opposite conductivity type. Such a transistor provides an efficient means for injecting hot carriers of the said opposite conductivity type using the high electric field produced in operation at the reverse-biased collector-base junction. This field is substantially normal to the surface and accelerates the charge carriers towards the surface. Thus, for example, it is possible to accelerate holes through approximately 2 volts within approximately 300 to 400 A of the said surface. This distance is still much larger than the mean free path for hot holes in, for example, silicon (namely approximately 100 A), but the maximum energy that a hole can lose in a collision is the optical phonon energy (63 meV), providing the voltage is below the threshold for ionising collisions. Thus, such a heated hole can undergo many collisions and still have enough energy to cross the barrier into the wide band gap portion. Those carriers that fail to cross, or fail to stay in the wide band gap material, are drained away by the collector electrode. High efficiency of injection is important in providing high luminescent output for the electroluminescent device.

In one form of such an inverted bipolar transistor, the said collector is a metal electrode layer which forms a rectifying junction with the base region. This metal electrode layer may be thin (for example at most 200 A) and may cover the whole surface of the narrow band gap portion where the surface is adjacent the wide band gap portion. However, it has been noticed that the effect of holes, for example pin-holes, in such a layer is not necessarily undesirable, so that the metal electrode layer may be discontinuous (for example in the form of a thicker, fine mesh on the narrow band gap portion) with the narrow band gap portion in contact with the wide band gap portion at apertures in this electrode situated therebetween. In another form of such an inverted bipolar transistor, the said collector consists of a shallow surface layer of the said opposite conductivity type adjoining the surface and thicker collector contact regions of the opposite conductivity type mutually spaced across the shallow surface layer, which collector contact regions provide the means for extracting the heated charge carriers not permanently injected in the wide band gap portion. The said shallow surface layer may have a thickness of, for example, at most 200 A. This surface layer may, in certain cases, be an inversion layer induced at the surface by charges at or near the surface. However, the surface layer may be an impurity-doped semiconductor region, and may have a type determining impurity concentration of at least $5 \times 10^{18}$ atoms/c.c. Either impurity ion implantation or impurity knock-on implantation may be employed to form this shallow surface layer of the collector. Mutually spaced high conductivity portions of the base region may be present adjacent the emitter-base junction below the mutually spaced collector contact regions, which high conductivity portions reduce the injection from the emitter region of minority charge carriers into those portions of the base region below the collector contact regions. A narrow high conductivity portion of the base region may be present adjacent the collector layer region and spaced from the emitter-base junction, which narrow high conductivity portion serves to concentrate near the surface the electric field produced at the collector-base junction under reverse bias.

When there is provided adjacent the wide band gap portion of the one conductivity such an inverted bipolar transistor structure having collector and emitter regions of the opposite conductivity type and a base region of the one conductivity type, a four-layer *p-n-p-n* transistor structure results which can have interesting electrical properties as a control element. Such a structure can have a current gain greater than unity when biasing in a conventional manner, and it can be switched into a high current, lower voltage state such that the current gain is unity. This effect should be used in providing a built-in memory.

The narrow band gap portion may be a portion of a semiconductor substrate of narrow band gap material, and the substrate may comprise regions of an integrated circuit of which the transistor structure is one circuit element for producing a luminescent output. The substrate may comprise a solid state array of such electroluminescent devices, each having such a transistor structure for hot minority change carrier injection. The integrated circuit may include a semiconductor memory system. When the substrate is of silicon, the achievement of such integration of various logic and memory functions for solid state displays should be comparatively simple and inexpensive. For large arrays of semiconductor electroluminescent devices, the cost of the semiconductor material is a significant factor. The material cost can be held low by using a common substrate of silicon to provide the narrow band gap portion and by providing the wide band gap material as layer portions where needed for luminescence at the silicon substrate surface.

The wide band gap portion may be for example of *n*-type zinc sulphide, cadmium sulphide, zinc selenide, zinc oxide, or possibly even silicon carbide. It may be provided as a layer portion on a narrow band gap substrate and have a thickness of, for example, at least 1 micron and at most 2 microns.

Embodiments of the present invention will now be described, by way of example, with reference to the diagrammatic accompanying drawings, in which.

Figure 1:
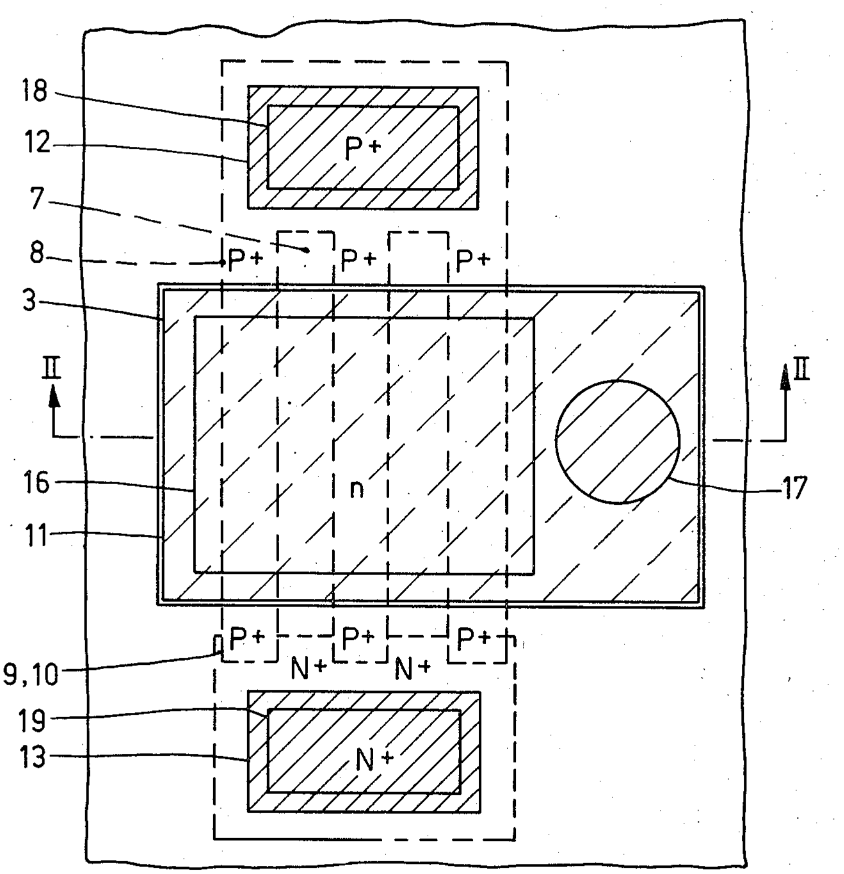
FIGS. 1 and 2 show an electroluminescent semiconductor device body in plan and cross-sectional views, respectively.
Figure 2:
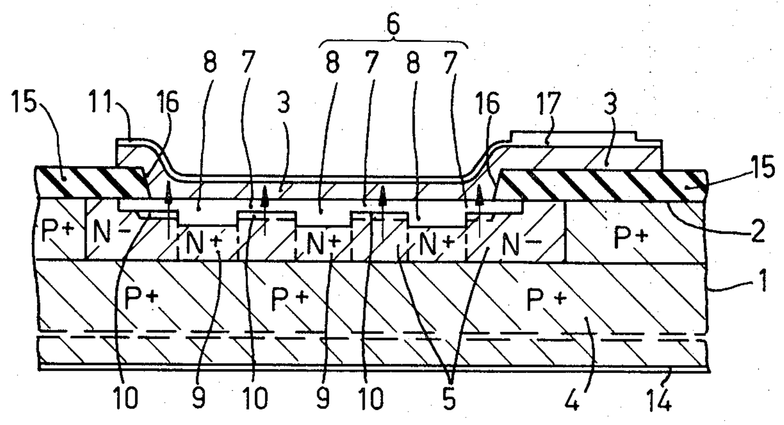
Figure 3:
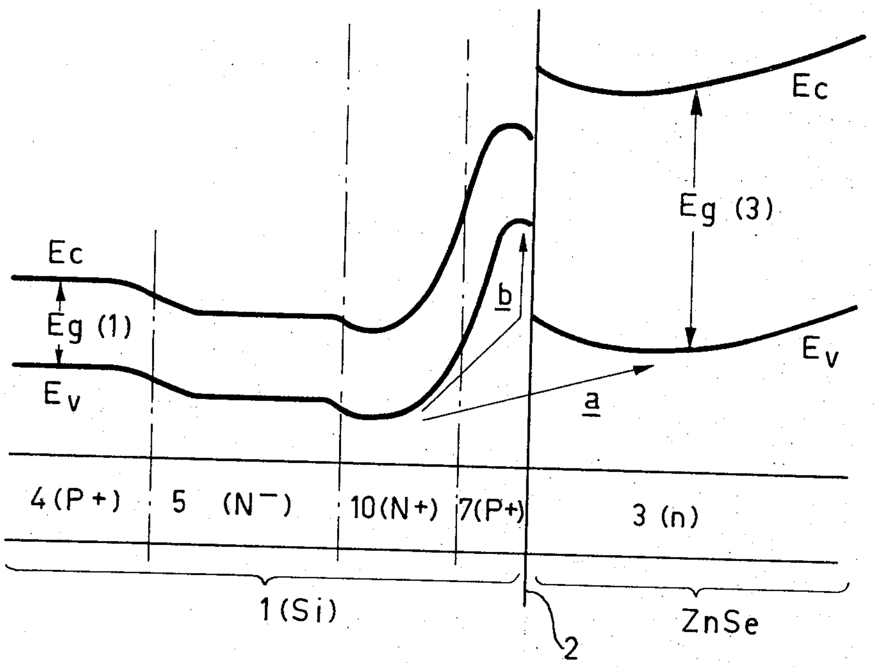
FIG. 3 shows a section through an active portion of the same device, in relation to an energy-level diagram.

The electroluminescent semiconductor device shown in FIGS. 1 to 3 comprises a semiconductor substrate 1 of narrow band gap material, namely silicon, and at part of a surface 2 of the substrate 1 a semiconductor layer portion 3 of wide band gap, luminescent material, namely zinc selenide. The layer portion 3 is of *n*-type conductivity, and has a thickness of between one and two microns. Part of layer portion 3 is present on thick insulating layer 15, around an aperture 16 in the insulating layer 15. The insulating layer 15 may be of silica and covers a major part of the surface 2 of the substrate 1. Part of the layer portion 3 is present at the aperture 16 in this layer 15, where it forms an abrupt heterojunction with the silicon substrate 1. The semiconductor energy band structure is discontinuous at the heterojunction, as is apparent from FIG. 3, which shows the device with bias voltages applied. In FIG. 3, $E_v$ and $E_c$ denote the valence and conduction bands, respectively. $E_g$ (1) denotes the forbidden band (energy band gap) in the silicon substrate 1, while $E_g$ (3)

denotes that in the zinc selenide layer portion 3. The various portions of the devices are denoted by the same reference numerals in FIG. 3 as in FIGS. 1 and 2.

A semi-transparent electrode 11 contacts the surface of the zinc selenide layer portion 3 remote from the silicon substrate 1. This electrode 11 is thin enough to transmit light emitted from the layer portion 3 at the aperture 16. A thickened part 17 of this electrode 11 is present on the part of the layer portion 3 on the insulating layer 15. This thickened part 17 permits the connection of a supply conductor to the electrode 11.

A transistor structure 4, 5, 6 is present in the silicon substrate 1 adjacent the zinc selenide layer portion 3 at the aperture 16. The transistor structure 4, 5, 6 is an inverted bipolar transistor which comprises a *p*-type collector region 6 situated at the surface 2 and separated by an *n*-type base region 5 from a surface-remote *p*-type emitter region 4; there are electrode connections 12, 13 and 14 to the collector, base and emitter regions 6, 5 and 4 respectively.

The emitter-base junction of the transistor structure 4, 5, 6 provides an arrangement for producing in the base region 5 from the emitter region 4 a current of holes which are minority charge carriers in relation to both the *n*-type selenide layer portion 3 and the silicon base region 5. Another arrangement is present at the reverse-biased collector-base junction for providing in the silicon substrate 1 adjacent the zinc selenide layer portion 3 such a high electric field for increasing the energy of holes so produced that, as indicated by arrows in FIG. 2, hot holes are injected from the silicon substrate 1 into the *n*-type zinc selenide layer portion 3, at the aperture 16, and produce luminescence in the zinc selenide layer portion 3. The collector region 6 and its electrode connection 12 provide means for extracting heated holes not permanently injected in the zinc selenide layer portion 3. To aid hole injection into the layer portion 3, the heterojunction is forward biased by a voltage applied between the electrode 11 and the collector electrode connection 12. Forward biasing the heterojunction reduces part of the barrier to holes, within the zinc selenide layer portion 3, as indicated by the dip in Ev in FIG. 3.

Arrow *a* in FIG. 3 indicates the passage of hot holes which are injected from the silicon substrate 1 into the zinc selenide layer portion 3. Arrow *b* shows the passage of holes which loose too much energy within the collector junction depletion layer in the silicon substrate 1 and so do not surmount the barrier into the zinc selenide; these holes are drained away by the collector of the transistor. Holes lose energy by phonon collisions in the silicon substrate 1; however the effect of such collisions in randomising the hole velocity is not shown on the arrows *a* and *b* in FIG. 3. To avoid loosing too much energy by ionizing collisions, the reverse voltage applied between collector and base should not exceed approximately 3 volts. The collector 6 consists of a shallow *p*-type semiconductor surface layer region 7 adjoining the surface 2 and thicker *p*-type collector stripe regions 8 spaced across the layer region 7. It is the collector stripe contact region 8 and the electrode 12 connected thereto that extract holes not permanently injected in the wide band gap zinc selenide material. The collector layer region 7 has a thickness of less than 200 A, and acceptor concentration of approximately $10^{19}$ atoms/c.c. and is provided by acceptor ion implantation at the surface 2 of the silicon substrate 1 prior to the provision of the zinc selenide layer portion 3.

Mutually spaced high conductivity portions 9 of the base region 5 are present adjacent the emitter-base junction below the mutually spaced collector stripe contact regions 8; these high conductivity portions reduce hole injection from the emitter region 4 into those portions of the base region 5 below the mutually spaced collector contact regions 8. Such base region injection does not aid the hole injection into the zinc selenide layer portion 3 and the luminous output of the device. A narrow high conductivity portion 10 of the base region is present adjacent the collector layer region 7 and spaced from the emitter-base junction. This narrow high conductivity portion 10 serves to concentrate near the surface 2 the electric field produced at the collector-base junction under reverse bias, as indicated in FIG. 3, and thus to provide more efficient heating of holes adjacent the surface 2.

As shown in the plan view of FIG. 1, the mutually spaced collector stripe contact region 8 extend to one side of the central portion of the service and terminate in a common large area surface region *p*+ of the silicon substrate 1. This surface region *p*+ is contacted by the collector electrode 12 in the form of a metal layer at an aperture 18 in a portion of the insulating layer 15 not covered by the zinc selenide layer portion 3.

The base region portions 9 below the collector contact regions 8 extend to the one side of the central portion of the device below the surface region *p*+. The base region portions 9 and 10 also extend to the opposite side, and both portions 9 and 10 terminate in a common large erea surface region N+ of the silicon substrate 1. This surface region N+ in contacted by the base electrode 13 in the form of a metal layer at an aperture 19 in a portion of the insulating layer 15 not covered by the zinc selenide layer portion 3. The emitter region 4 is contacted by metal layer electrode 14 on the opposite surface of the substrate 1.

The base region 5 of the transistor can be formed from a high resistivity *n*-type silicon epitaxial layer provided on a high conductivity *p*-type silicon support. The *p*-type support provides the emitter region 4, and the emitter junction is caused to terminate at the surface 2 by providing high conductivity *p*-type diffused wall regions *p*+ across the thickness of the *n*-type epitaxial layer. The portions 9 of the base region may be formed by a diffused buried layer at the interface between the epitaxial layer and support. The portions 10 of the base region 5 and the portions 7 and 8 of the collector region 6 can be provided by ion implantation prior to providing the zinc selenide layer portion 3.

It will be evident that the emitter electrode could be provided at the surface 2 of the substrate 1, when not covered by the zinc selenide layer portion 3, and could contact the wall regions *p*+. *Instead of a p*-type support providing the emitter region 4, in this case, the emitter 4 may consist of *p*-type wall regions and a *p*-type buried layer.

Figure 4:
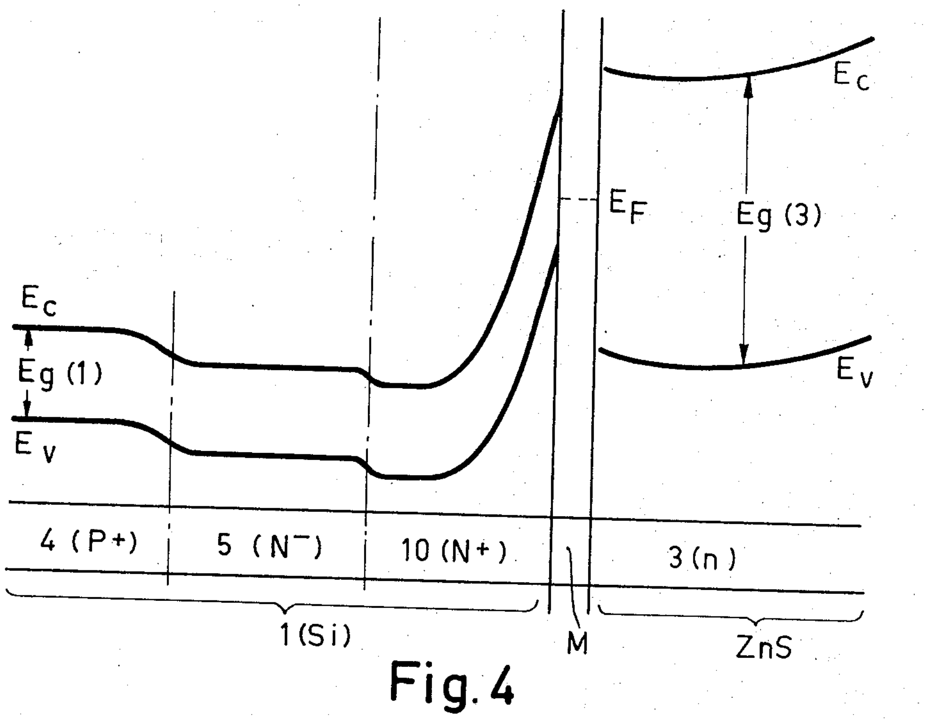
FIG. 4 shows a section through an active portion of another electroluminescent semiconductor device, in relation to an energy-level diagram.

The device shown in FIG. 4 is similar to that of FIGS. 1 to 3, except that the shallow collector surface layer 7 is replaced by a thin metal layer electrode M on the surface of a silicon substrate 1, the collector contact regions 8 and high conductivity base region portions 9 are omitted, and the wide band gap portion is of zinc sulphide.

Corresponding portions of this device are denoted by the same reference numerals in FIG. 4 as in FIGS. 1 to 3. As shown in FIG. 4, the semiconductor energy band structure is discontinuous at the heterojunction between the zinc sulphide layer portion 3 and the silicon substrate 1, which heterojunction is where the metal layer M is located. The metal layer M has a thickness of approximately 100 A, and forms a rectifying junction with the high conductivity portion 10 of the *n*-type base region 5. The layer M thus constitutes the collector of the transistor structure 4, 5, M, and under reverse bias, this junction provides the required high electric field for increasing the energy of holes emitted by the emitter 4 so that hot holes are injected from the silicon substrate 1 into the *n*-type sulphide layer portion 3 and produce luminescence therein. The metal layer M is thin enough to permit injection therethrough of hot holes, but thick enough to provide an adequate electrode for draining away those hot holes not permanently injected in the layer portion 3. It has been found that the effect of pin-holes on the device characteristics is not necessarily undesirable, so that the metal electrode layer M may be made in the form of a fine mesh with the silicon and the zinc sulphide being in contact with each other at the fine apertures in this layer M.

A further embodiment of the present invention will now be described by way of example with reference to the Figure (designated FIG. 5) of the accompanying diagrammatic drawing.

Figure 5:
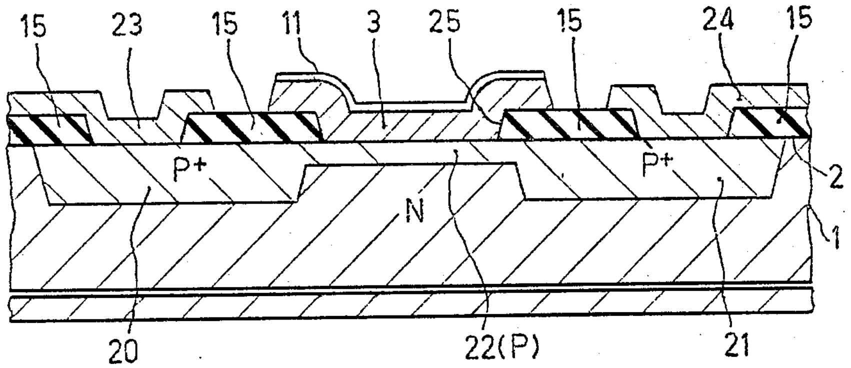
FIG. 5 is a sectional elevation view of an electroluminescent semiconductor device according to another embodiment of the invention.

FIG. 5 shows, in cross-sectional view, a further electroluminescent semiconductor device in accordance with the present invention. Parts of this device corresponding to parts of the device of FIGS. 1 and 2 are designated by the same reference numerals in FIG. 5 as in FIGS. 1 and 2. In this device, the high electric field which provides heating of charge carriers is produced substantially parallel to major surface 2 of the silicon substrate 1. The substrate 1 includes a transistor structure 20, 22, 21. The transistor structure 20, 22, 21 comprises at the silicon surface 2 source 20, drain 21, and channel 22 of a field effect transistor located in the silicon adjacent the wide band gap portion 3. The channel 22 is a shallow surface layer of the *p*-type conductivity type in a part of the narrow band gap substrate 1 of the *n*-type conductivity type. The source and drain 20 and 21 comprise source and drain electrodes 23 and 24 contacting source and drain regions 20, 21 which are *p*-type conductivity and are present in the *p*-type part of the silicon substrate 1. The shallow surface layer 22 forming the channel is an impurity-doped semiconductor region, preferably, for example, formed by implanted acceptor impurity, such as boron. The implantation may be effected by conventional implantation of acceptor impurity ions at the surface 2 of the narrow band gap substrate 1 where the wide band gap portion 3 is to be provided. In another form, the implantation is effected by ion bombardment of a layer of acceptor impurity at the surface 2, which bombardment is such as to knock, by energy transfer, impurity atoms from the acceptor layer into the silicon surface to form the shallow surface layer 22. The length of the channel 22 between the source and drain regions 20 and 21 is preferably of sub-micron dimensions to produce a high electric field between these regions 20 and 21. The regions 20 and 21 may be formed by acceptor impurity diffusion.

Such a field effect transistor provides means for injecting hot holes using the high electric field produced in operation between the source and drain. This field is substantially parallel to the surface 2, as is the carrier drift in this device. The temperature of the holes flowing in the direction of the high electric field can be raised to several times the lattice temperature. The high electric field may be of the order of $10^4$ or $10^5$ volts/cm. The source 20, 23 provides the arrangement for producing the hole current, and the drain 21, 24 provides the means for extracting those heated holes not permanently injected into the wide band gap portion 3.

The wide band gap portion 3 may be of a layer of *n*-type zinc sulphide, selenide or oxide, or cadmium sulphide, for example, The layer portion 3 is deposited at a window 25 in insulating layer 15 at the silicon surface 2. The window 25 is located at the area of the channel layer 22 in which the hole current is heated. It is at this window 25 that hot holes are injected into the wide band gap layer portion 3. A semi-transparent electrode 11 contacts the surface of the layer portion 3 remote from the silicon substrate 1. This electrode 11 is thin enough to transmit light emitted from the layer portion 3 adjacent the window 25. A thickened part of the electrode 11 is spaced from the area of window 25 and permits the connection of a supply conductor to the electrode 11. To aid hole injection into the layer portion 3, the heterojunction between the layer portion 3 and the substrate 1 is forward biased by a voltage applied to the electrode 11 in order to reduce the barrier to holes.

I claim:

1. An electroluminescent semiconductor device comprising:

a. a first semiconductor body portion of a first conductivity type comprising wide energy band gap, luminescent material;

b. a second semiconductor body portion adjacent said first portion, said second portion comprising narrow energy band gap material and forming with said first portion an abrupt heterojunction at which the semiconductor energy band structure is discontinuous; and c. a transistor structure located at said second portion adjacent said first portion and comprising electrode connections to various regions thereof, said transistor structure further comprising:

i. first means for producing a current of charge carriers of an opposite second conductivity type in said second portion, ii. second means for providing in said second portion a high electric field for increasing the energy of said charge carriers produced by said first means so that hot said charge carriers of said second conductivity type are injected from said second portion into said first portion to produce luminescence therein, and iii. third means located adjacent said first portion for extracting from said first portion those of the heated said charge carriers of said second conductivity type not permanently injected into said first portion.

2. A device as claimed in claim 1, wherein said transistor structure is a field effect transistor comprising source, drain, and channel elements at the surface of said second portion located adjacent said first portion, said channel element comprising a shallow surface layer of said second conductivity type in a part of said second portion.

3. A device as claimed in claim 2, wherein said source and drain elements respectively comprise sourcenand drain regions of said opposite conductivity type present in part of said second portion and further comprise sourcenand drain electrodes contacting said source and drain regions.

4. A device as claimed in claim 2, wherein said shallow surface layer comprises a semiconductor region comprising implanted doping impurity of said second conductivity type.

5. A device as claimed in claim 1, wherein said transistor structure is an inverted bipolar transistor comprising a collector situated at the surface of said second portion, a base region of said first conductivity type, and a surface-remote emitter region of said second conductivity type, said base region separating said collector and said emitter region.

6. A device as claimed in claim 5, wherein the said collector comprises a thin metal electrode layer forming a rectifying junction with said base region.

7. A device as claimed in claim 5, wherein said collector comprises a shallow surface layer of said second conductivity type adjoining said surface and mutually spaced thicker collector contact regions of said second conductivity type disposed across said shallow surface layer, whereby said collector contact regions provide means for extracting minority chage carriers not permanently injected in the wide band gap material comprising said first portion.

8. A device as claimed in claim 7, wherein said shallow surface layer has a maximum thickness of about 200 A.

9. A device as claimed in claim 7, wherein said collector shallow surface layer has a doping impurity concentration of at least about $5 \times 10^{18}$ atoms/c.c.

10. A device as claimed in claim 7, wherein said shallow surface layer comprises a region comprising implanted doping impurity.

11. A device as claimed in claim 7, wherein said base region comprises mutually spaced high conductivity portions located adjacent the emitter-base junction and below said mutually spaced collector contact regions, whereby said high conductivity base portions reduce injection of minority charge carriers from said emitter region into those portions of said base region located below said mutually spaced collector contact regions.

12. A device as claimed in claim 7, comprising a narrow high conductivity portion of said base region located adjacent said collector layer region and spaced from said emitter-base junction, whereby said narrow high conductivity portion serves to concentrate the electric field produced at the collector-base junction under reverse bias.

13. A device as claimed in claim 1, wherein said second portion comprises part of a semiconductor substrate of narrow band gap material, said substrate further comprising an integrated circuit comprising said transistor structure as a circuit element for producing a luminescent poutput.

14. A device as claimed in claim 13, wherein said integrated circuit includes a semiconductor memory store.

15. A device as claimed in claim 1, wherein said narrow band gap material consists essentially of silicon.

16. A device as claimed in claim 1, wherein said wide band gap first portion consists essentially of *p*-type material selected from the group consisting of zinc sulphide, cadmium sulphide, zinc selenide and zinc oxide.

17. A device as claimed in claim 1, wherein the maximum thickness of said wide band gap first portion is about 2 microns.

* * * * *